Figures 1, 2:
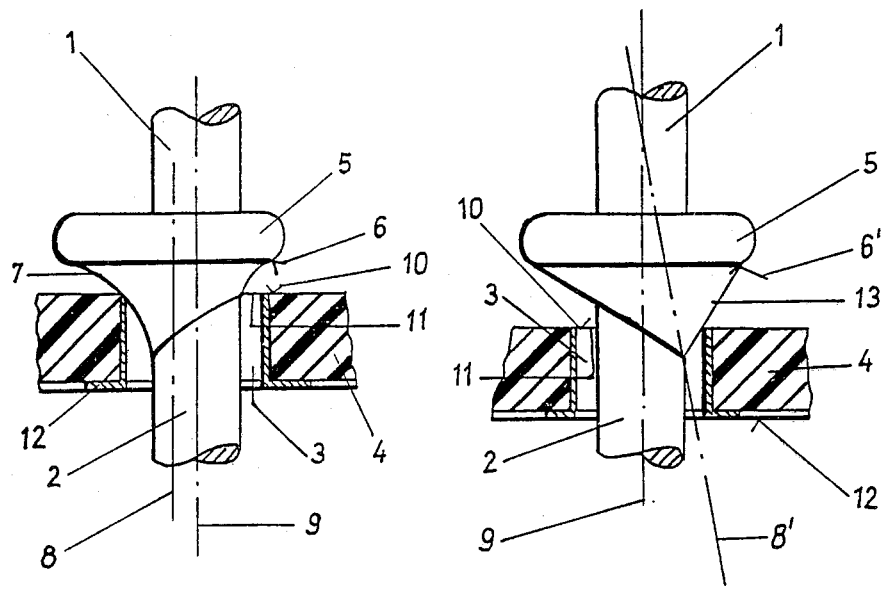

United States Patent [19]

Poensgen

[11] 4,246,627
[45] Jan. 20, 1981

[54] ELECTRICAL CIRCUIT ELEMENT WITH MULTIPLE CONECTION PINS FOR SOLDER PLUG-IN CONNECTION

[75] Inventor: Helmut H. Poensgen, Rückersdorf, Fed. Rep. of Germany

[73] Assignee: Stettner & Co., Nurenberg, Fed. Rep. of Germany

[21] Appl. No.: 20,328

[22] Filed: Mar. 14, 1979

[51] Int. Cl.³ .................................... H05K 01/04
[52] U.S. Cl. ....................... 361/405; 339/275 B; 339/220 T; 361/404; 361/408; 174/52 PE
[58] Field of Search ............... 361/405, 404, 408; 339/275 B, 220 T; 29/626, 630 D, 630 G; 174/68.5

[56] References Cited

U.S. PATENT DOCUMENTS

| | | | |
|---|---|---|---|
| 3,059,152 | 10/1962 | Khouri | 361/404 |
| 3,076,164 | 1/1963 | Ullman | 339/275 BX |
| 3,185,952 | 5/1965 | Potter | 339/275 BX |
| 3,239,720 | 3/1966 | Rayburn | 361/405 |
| 3,307,246 | 3/1967 | Gulliksen | 361/404 X |
| 3,497,859 | 2/1970 | Bang | 361/405 X |
| 3,500,538 | 3/1970 | Raciti | 29/630 D |
| 3,546,362 | 12/1970 | Berger | 361/405 X |
| 3,604,836 | 9/1971 | Pierpont | 361/405 X |
| 4,056,302 | 11/1977 | Braun | 29/630 DX |

FOREIGN PATENT DOCUMENTS 2448296  4/1976  Fed. Rep. of Germany ....... 339/275 B Primary Examiner—Richard R. Kucia
Attorney, Agent, or Firm—Frishauf, Holtz, Goodman & Woodward

[57] ABSTRACT

To seat an electrical circuit element in a metallized opening of a circuit board and permit escape of solder gases, a bead is placed on the insertion pin and formed with a surface facing the support board which is non-symmetrical with respect to the axis of the pin, and of the insertion opening. Preferably, the surface is conical, and on adjacent pins the cone angles are tilted in opposite directions to provide for the non-symmetrical positioning of any one cone and centered placement of the insertion pins in the insertion openings.

10 Claims, 3 Drawing Figures

ELECTRICAL CIRCUIT ELEMENT WITH MULTIPLE CONECTION PINS FOR SOLDER PLUG-IN CONNECTION

Reference to related literature: U.S. Pat. Nos. 3,293,514 and 3,604,836 and Nos. 330,776 and 907,596. U.S. Ser. No. 20,362, filed Mar. 14, 1979, HOESCH, assigned to the assignee of the present application.

The present invention relates to a connection arrangement for an electrical circuit element, particularly for a circuit element having multiple connection pins which are arranged for insertion into a metallized opening of a support substrate, such as a printed circuit (PC) board.

BACKGROUND AND PRIOR ART

Various electronic components have extending projecting pins or connecting wires arranged for connection to printed circuit boards, for example by manual or automatic insertion. To precisely position these elements, it has been proposed to form them with a circumferential ring-shaped bead. Such beads are usually made by dipping the connecting wire into a bath of molten tin and providing for controlled cooling thereof so that the tin which adheres to the wire will form a bead in the form of a circumferential, laterally extending ring (see German Disclosure Document DE-OS 2346340).

It has also been proposed—see German Utility Model Patent DE-GM 7709932—to form the lower side of the bead in the shape of a cone, for example by deformation of the pin, and to dip the entire assembly excluding the cone but up to the cone into an encapsulating compound surrounding the circuit element and the pin or wire up to the upper surface of the bead, the latter thus forming a limit stop for the encapsulating compound by dipping.

It has been found that, if such a connection pin with a bead thereon is inserted into an opening of a printed circuit board, the bead will provide a tight seat against the upper side of the printed circuit board. It has been found that, in spite of care and tight seating, the solder connection between such a pin and the metallized surface on the printed circuit board or other substrate may not be perfect, and "cold solder" joints may occur.

THE INVENTION

It is an object to reliably and accurately seat an electrical circuit element on a PC board, and permit soldering, particularly dip-soldering or wave-soldering, of the connection pin or wire to the circuit support—hereinafter, for simplicity, the PC board, although it may be a ceramic plate or other structure—to form a reliable solder connection without defects.

Briefly, the bead surrounding the insertion pin or wire has a bottom surface which is non-symmetrical or uneven with respect to the axis of the pin or wire itself. Consequently, the lower edge of the bead will not be in continuous surface engagement with the PC board or other substrate so that gases, vapors, flux residues and other contaminants which occur during the soldering process can escape upwardly through the opening in the PC board and the gap formed between the lower edge of the bead and the board at the zone where the dissymmetry provides this gap. Thus, solder metal can penetrate in the bore, completely wet the connection pin or wire as well as the metallized portions within the bore and form a reliable continuous solder connection without blow holes or entrapped gas cushions and consequent adjacent cold solder joints.

The invention is based on the realization that, upon soldering, and particularly upon dip-soldering, gases and remnants of solder flux cannot escape upwardly through the opening between the connecting pin and the inner surface of the opening if the bead is seated tightly against the top surface; thus, tight application of the connecting pin against the printed circuit board is contraindicated from point of view of a good solder connection, precisely since the gases cannot escape and, if trapped, may form a pillow around which capillary penetration of the molten solder cannot occur. The result is a poor solder joint or a cold solder joint between the connecting pin or wire and the metallized portion of the surface of the substrate or its surrounding area. So shaping the bead that a passage, or a plurality of passages, is left free for the escape of gases then permits capillary penetration of the solder uniformly throughout the wire pin and the formation of a perfect, tight joint. The molten solder, thus, can flow to the connecting wire and, in circuit boards which are metallized at least in part throughout the length of the opening, can rise in the bore or opening up to the top surface of the printed circuit board. This is particularly applicable for wave-soldering operations.

Practicing the invention additionally easily permits the formation of a mechanically tight engagement seat between the connecting pin or wire and the surrounding surface of the substrate or printed circuit board; if the bead is deformed, a similar deformation step can be carried out practically simultaneously or simultaneously on the wire or pin, so that a single manufacturing step can accomplish a multitude of effects.

DRAWINGS

Figure 3:
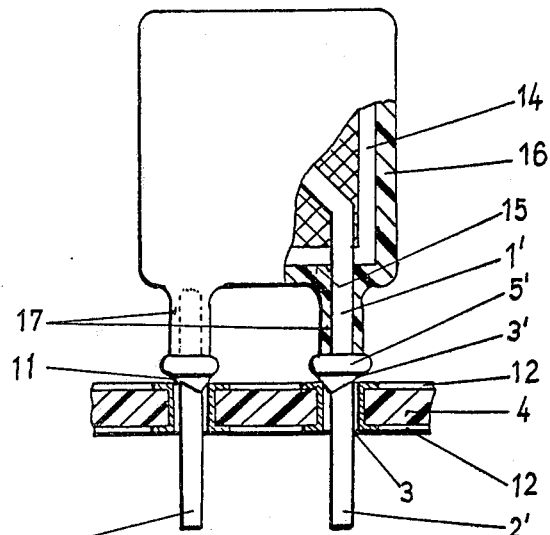

Illustrating preferred embodiments:

FIG. 1 is a front view, partly in section, of a connection arrangement, to a greatly enlarged scale, in which a bead is provided having a center line axially offset with respect to the axis of the connection pin or wire;

FIG. 2 is a view similar to FIG. 1, rotated 180°, and illustrating a bead which has a cone located at the bottom side thereof, having an axis of symmetry forming an acute angle with respect to the axis of the connection pin or wire; and FIG. 3 illustrates connection of an electrical circuit element, as shown a ceramic capacitor, having beads in accordance with FIG. 2—although they could be in accordance with FIG. 1 or similar structure as well—and illustrating the relative arrangements of the off-center position of the lower surface of the beads to provide for centered seating of the respective connection pins in the PC board.

A connection wire or pin 1 (FIG. 1) is connected to an electrical circuit component, for example a ceramic capacitor 14 (FIG. 3). The lower portion or end 2 of the connection pin 1 is fitted into a bore or opening 3 of a PC board 4. The connection pin 1 has a circular bead 5 formed thereon, for example made by upsetting of the pin 1.

In accordance with the present invention, the lower surface 6 of the bead 5 is non-symmetrical with respect to the axis 9 of the pin 1. As shown in FIG. 1, the lower surface 6 is concave as seen at 7, and thus is non-symmetrical and uneven, since the concave upset region is so laterally offset with respect to the axis of symmetry 9 of the pin 1 that the center line 8 of the concave deformation is eccentric with respect to the axis 9. The lateral shift of the concave portion 7 provides for a wider radial distance from the axis 9 of the concave surface at one side, and a longer extent of the portion 7 within the opening 3 of the PC board 4. Upon introduction of the wire 1 into the bore 3 in centered relation with respect to the bore, the concave region 7, at the location of greater radius from the axis 9, will engage the upper edge 10 of the PC board 4, adjacent the bore 3 thereof, leaving at the opposite side a gap 11 between the lower portion or surface 6 of the bead 5 and the edge 10 of the opening 3. This gap 11 permits escape of gases, vapors, and other contaminants occurring in the soldering operation, so that solder metal can easily rise within the gap formed between the surface of the end portion 2 of the pin and the inner surface of the opening 3, including that portion of the surface defined by the concave lower part 7 of the bead 5. This is particularly important if the opening 3 is metallized throughout its inner extent, for subsequent connection to a printed circuit conductive path or strip, for example, thus ensuring reliable solder connection between the pin 1 and the entire metallized surface inside the opening 3 of the PC board 4.

The bead 5 may have various shapes at the lower surface thereof. FIG. 2, for example, shows application of a cone element 13 to the bead 5, which can be formed in one upsetting operation in a suitable die simultaneously with formation of the bead 5. The axis of symmetry 8' of the cone forms an acute angle with the center line or axis 9 of the pin 1. The gap 11 is again formed between that portion of the cone 13 which is lifted off the edge 10 of the PC board 4, when the pin 1 is centered in the opening 3, placing the cone 13 attached to the lower side 6' of the bead 5 in the position shown in FIG. 2. Rather than using a cone 13, a concave arrangement similar to FIG. 1 can be used or, alternatively, a straight cone 13 with its axis of symmetry shifted laterally, but parallel to the axis 9, can be applied to the lower surface 6' of the bead 5. Various other arrangements are, of course, possible, the important feature being, however, to leave a gap 11 for escape of gases upon dip-soldering of the connection.

Providing a cone with an inclined axis of symmetry 8' (FIG. 2) so positions the cone 13 that, at any point of the circumference thereof, the angle of the cone mantle or shroud is different than the angle with respect to the axis 9. Upon either centric or eccentric insertion of the end portion 2 of the connection pin 1 in the bore 3 will thus always result in a gap 11, even if the pin 1 is not precisely centered within the bore 3, as can be readily seen by an imaginary shifting of the relative positions of the PC board 4 and the wire 1 in FIG. 2.

The arrangement is particularly suitable when applied to an electronic circuit component such as a capacitor 14 (FIG. 3) having two or more connection pins or wires 1, 1' with end portions 2, 2'. The two connection wires 1, 1' are spaced from each other by predetermined spacing determined by standards for insertion into standard punched PC boards 4, or a multiple thereof. Preferably, the lower portions of the beads are similar but rotated with respect to each other by 180°. This reliably centers the end portions 2, 2' of the pins 1, 1' in the openings 3, 3' of the PC board 4 and reliably defines a gap 11 to form a passage from the underside 6 of the bead 5 and between the edge 10 of the opening 3 for escape of the gases and contaminants arising during the soldering process. In accordance with a preferred embodiment, the bead 5 is located close to the lower edge 15 of the circuit element 14. Upon turning the circuit element 14 upside-down and dipping it into an encapsulating compound 16, the beads 5 then will form a precise outer limit of the encapsulating compound, while still permitting covering of the projecting connection wires 1, 1' from the circuit element 14, so that these portions of the connection wires are also protected. Yet, the beads 5 will prevent the formation of excessive run-down of encapsulating compound extending over the end portions 2, 2' of the wire where the encapsulating compound would interfere with proper soldering. Thus, the covering of encapsulating compound 17 in the form of sleeves extending around the wires 1, 1' is limited to the upper surface of the beads 5, which form a limit shoulder for the encapsulating compound and prevent further coating of the wires 1, 1'.

The connection arrangement is useful with any kind of electrical or electronic circuit component having wire or pin connections suitable for solder connection with printed circuit boards, that is, the electronic element 14 may be a resistor, diode, transistor, an integrated circuit, thick-film or thin-film modules, potentiometers, negative temperature resistors, or any other active or passive circuit element, or combination of circuit elements.

Various changes and modifications may be made, and features described in connection with any one of the embodiments may be used with any of the others, within the scope of the inventive concept.

I claim:
1. Electrical circuit element (14) for combination with a circuit support (4) and including an electrical solder-plug-in connection arrangement,
   wherein the circuit element (14) has at least one projecting connection pin or wire (1) projecting therefrom, for insertion into a respective, at least partly metallized and essentially circular opening (3) in the circuit support (4), and for subsequent soldering therein,
   said connection pin or wire (1) being formed with an essentially circular, circumferentially essentially uniform bead (5) to define an insertion position of the pin or wire into the opening,
   wherein, in accordance with the invention, the surface (6) of the bead (5) facing the surface of the support (4) is non-symmetrical with respect to the axis (9) of the opening (3) in the support (4).
2. Circuit element according to claim 1, wherein (FIG. 1) the side (6) of the bead (5) facing the surface of the support (4) comprises a circumferentially concave region or zone (7).
3. Circuit element according to claim 1, wherein (FIG. 2) the side (6) of the bead (5) facing the surface of the support (4) comprises a conical surface (13).
4. Circuit element according to claim 1, wherein (FIG. 1) the side (6) of the bead (5) facing the surface of the support (4) has an axis of symmetry (8) which is laterally eccentric with respect to the axis (9) of the opening (3).
5. Circuit element according to claim 1, wherein (FIG. 2) the side (6) of the bead (5) facing the surface of the support (4) has an axis of symmetry (8') which forms an acute angle with the axis of symmetry (9) of the opening (3) in the support (4).
6. Circuit element according to claim 5, wherein (FIGS. 1, 2) the side (6) of the bead (5) facing the surface of the support (4) comprises a shape which is at least approximately conical.

7. Circuit element according to claim 1, wherein the circuit element has two projecting connection pins or wires (1), and the dissymmetry of position of the side (6) of the bead (5) facing the surface of the support (4) on a respective pin differs from the position of the dissymmetry of the other pin.

8. Circuit element according to claim 7, wherein the dissymmetries of the respective pins are rotated with respect to each other by an angle of about 180°.

9. Circuit element according to claim 1, further including an encapsulating compound (16) surrounding the circuit element and extending up to the upper surface of the bead, said upper surface forming a limit stop for the encapsulating compound.

10. Circuit element according to claim 1, wherein (FIG. 2) the side (6) of the bead (5) facing the surface of the support (4) has an axis of symmetry (8') which is non-congruent with the axis of symmetry (9) of the opening (3) in the support;

the side (6) of the bead (5) facing the surface of the support (4) comprises a shape which is at least approximately conical; and the circuit element has at least two projecting connection pins or wires (1) and the dissymmetry of position of the side of the bead facing the surface of the support on one pin is rotated with respect to the dissymmetry of the other pin by an angle of about 180°.

* * * * *

UNITED STATES PATENT AND TRADEMARK OFFICE
CERTIFICATE OF CORRECTION

PATENT NO. : 4,246,627
DATED : January 20, 1981
INVENTOR(S) : Helmut H. Poensgen It is certified that error appears in the above—identified patent and that said Letters Patent is hereby corrected as shown below:

On the title page add the following:

-- [30] Foreign application priority data

Mar. 23, 1978    Fed. Rep. Germany......28 12 768 --.

Signed and Sealed this

Second Day of June 1981

[SEAL]

Attest:

RENE D. TEGTMEYER

Attesting Officer

Acting Commissioner of Patents and Trademarks